(54) SURFACE ACOUSTIC WAVE DEVICE (75) Inventors: Morio Ogura, Hirakata; Naoki Tanaka, Sakai, both of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/533,667

(22) Filed: Mar. 23, 2000

(30) Foreign Application Priority Data

Mar. 25, 1999 (JP) .................................................. 11-081650

(51) Int. Cl.[7] .................................................. H01L 41/04
(52) U.S. Cl. ................................. 310/313 R; 310/313 A
(58) Field of Search ........................... 310/313 R, 313 B; 333/193

(56) References Cited

U.S. PATENT DOCUMENTS

| | | | | |
|---|---|---|---|---|
| 3,965,444 | * | 6/1976 | Willingham et al. | 310/313 A |
| 5,646,468 | * | 7/1997 | Nakahata et al. | 310/313 A |
| 5,719,538 | * | 2/1998 | Kadota | 333/193 |
| 5,731,748 | * | 3/1998 | Tada | 333/193 |
| 5,760,522 | * | 6/1998 | Kobayashi et al. | 310/313 A |
| 5,760,524 | * | 6/1998 | Higgins, Jr. et al. | 310/313 A |
| 5,998,907 | * | 12/1999 | Taguchi et al. | 310/313 R |
| 6,025,636 | * | 2/2000 | Nakahata et al. | 257/416 |
| 6,037,699 | * | 3/2000 | Kobayashi et al. | 310/313 A |

OTHER PUBLICATIONS

Li et al. Investigation of Surface Leaky Longitudinal Waves in Lithium Niobate Substrates. 1997 IEEE International Frequency Control Symposium. May 28–30, 1997.*

Zaitsev et al. Characteristics of Quasi–Shear–Horizontal (QSH) Acoustic Waves in Thin Piezoelectrc Plates. 1998 IEEE Ultrasonics Symposium Oct. 5–8, 1998.*

Lee et al. Thin–Film Lithium Niobate on Diamond–Coated Silicon Substrates for Surface Acoustic Wave Applications. 1999 IEEE Ultrasonics Symposium. Oct. 17–20, 1999.*

Hickernill et al. The Use of Design of Experiments for the Optimization of Deposited Glass on Saw Filters. 1999 Joint Meeting EFTF–IEEE International Frequency Control Symposium. Apr. 13–16, 1999.*

Zaitsev et al. Propagation of QSH (Quasi Shear Horizontal) Acoustic Waves on Piezoelectric Plates. IEEE Transactions on Ultrasonics, Ferroelectrics, and Frequency Control, vol. 46, No. 5. Sep. 1999.*

Kuznetsova et al. Investigation of Acoustic Waves in Thin Plates of Lithium Niobate and Lithium Tantalate. IEEE Trans. on Ultrasonics, Ferroelectric, and Frequency Control, vol. 48, No. 1, Jan. 2001.*

* cited by examiner

*Primary Examiner*—Nestor Ramirez
*Assistant Examiner*—Peter Medley
(74) *Attorney, Agent, or Firm*—Armstrong, Westerman, Hattori, McLeland & Naughton, LLP (57) ABSTRACT

An SAW device including a glass substrate, an $LiNbO_3$ (LT) substrate, and an electrode. When a pitch of the electrode is $\lambda$, a thickness of the LT substrate is H, and K equals to $2\pi/\lambda$, a product of K and H is at least 0.5 and at most 1.5. Accordingly, a SAW device which can advantageously reduced in size by a reduction in propagation velocity and which is provided with high $K^2$ and an enhanced temperature characteristic as having a good temperature characteristic of the LT substrate.

2 Claims, 9 Drawing Sheets

SURFACE ACOUSTIC WAVE DEVICE

BACKGROUND OF THE INVENTION

1. Field of the Invention

The present invention relates to surface acoustic wave (SAW) devices.

2. Description of the Background Art

SAW devices include SAW oscillators, transversal SAW filters and oscillator type SAW filters, which are used for different purposes. In the following, a SAW filter will be described as one type of a SAW device.

Figure 17:
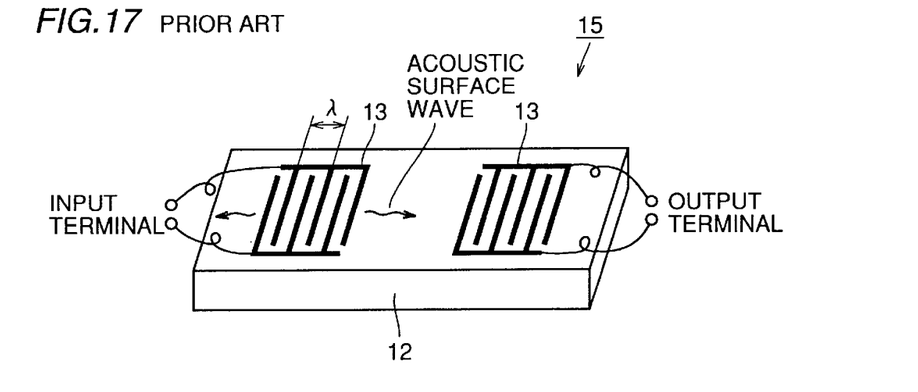
FIG. 17 is a perspective view showing a structure of a general SAW filter.

FIG. 17 is a perspective view schematically showing a structure of a SAW filter. Referring to FIG. 17, SAW filter 15 basically includes a piezoelectric substrate 12, and a four-terminal structure formed on a surface of piezoelectric substrate 12 and having two pairs of comb-shaped electrodes 13 respectively used for exciting and receiving surface waves. Such electrodes 13 are called interdigital electrodes, and this type of transducer is called an IDT (Interdigital Transducer).

Figure 18:
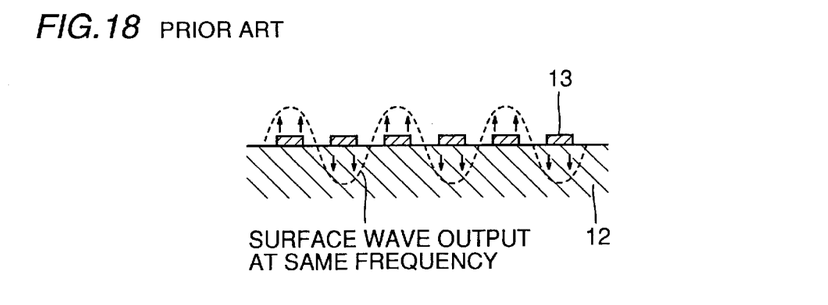
FIG. 18 is a diagram shown in conjunction with an operation of the SAW filter shown in FIG. 17.

Referring to FIG. 18, generally, when an impulse voltage is applied to comb-shaped electrodes 13 for excitation, strains of opposite phases are caused between adjacent electrodes 13 by a piezoelectric effect, thereby exciting a SAW. The SAW propagates on the surface of piezoelectric substrate 12. The strains caused by the SAW produce electric charges at the surface of piezoelectric substrate 12, which are, in turn, received as electric signals by comb-shaped electrodes 13 for reception.

Figure 19:
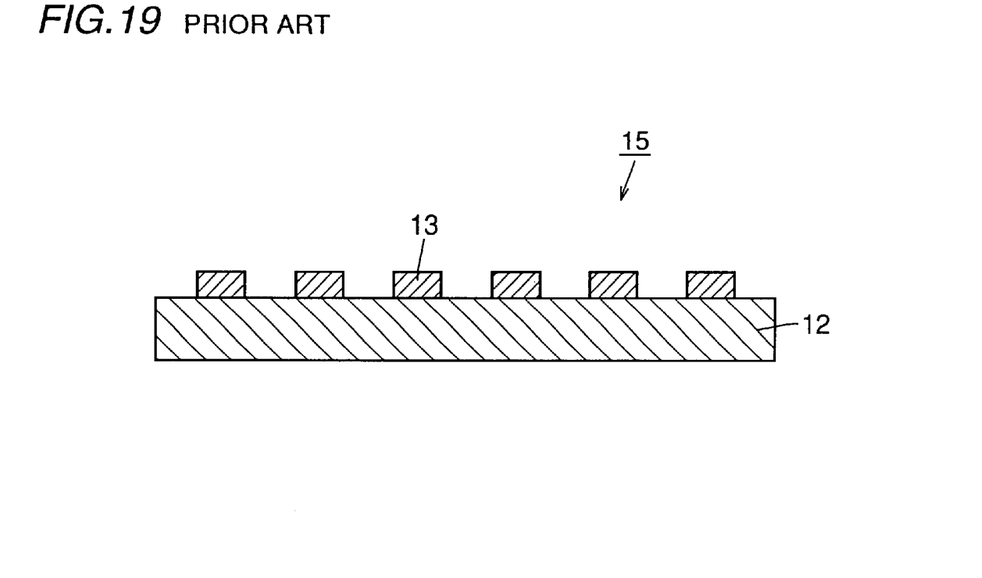
FIG. 19 is a cross sectional view schematically showing a structure of a conventional SAW device.

Conventionally, the SAW device such as SAW filter 15 has a structure in which electrodes 13 in accordance with the purpose of the device are formed on the surface of piezoelectric substrate 12, as shown in FIG. 19. The characteristic of SAW device 15 depends largely on the characteristic of piezoelectric substrate 12, which is also used according to the purpose of the device. Table 1 shows typical materials used for piezoelectric substrate 12 and characteristics of an SAW propagating on piezoelectric substrate 12.

TABLE 1

Characteristics of Substrate for Typical SAW device

| substrate | Eulerian angles $\phi, \theta, \Psi$ | propagation velocity [m/s] | $K^2$ [%] | TCD [ppm/° C.] | propagation mode |
|---|---|---|---|---|---|
| quartz | 0°, 132.75°, 0° | 3159 | 0.12 | 0 | Rayleigh wave |
|  | 0°, 15°, 0° | 3948 | 0.11 | 0 | Leaky wave |
| LiTaO$_3$ | 90°, 90°, 112° | 3328 | 1.1 | 16.5 | Rayleigh wave |
|  | 0°, 126°, 0° | 4211 | 4.7 | 45.1 | Leaky wave |
| LiNbO$_3$ | 0°, 38°, 0° | 4007 | 5.2 | 71.4 | Rayleigh wave |
|  | 0°, 154°, 0° | 4731 | 10.9 | 61.3 | Leaky wave |

As shown in Table 1, a quartz substrate has a good temperature characteristic (value near zero), but the electromechanical coupling factor ($K^2$) is disadvantageously small. For an LiNbO$_3$ (LN) substrate, although $K^2$ is sufficiently high, the temperature characteristic such as a temperature coefficient of a delay time (TCD), is disadvantageously high. Substrates using LiTaO$_3$ (LT) conventionally include an X-112° Y LT substrate (LT of 90°, 90°, 112°) in an Eulerian angles representation). The conventional LT substrate has a characteristic intermediate between those of a quartz substrate and the LN substrate.

Thus, the substrates have their own advantages and deficiencies, so that they are used according to the specific purposes of the device. Recently, with technological developments in the field of display units including televisions and telecommunication apparatuses including portable telephones, SAW devices used therefor are also required to have enhanced properties.

Now, Eulerian angles in the above Table 1 will be described with reference to FIG. 20.

Figure 20:
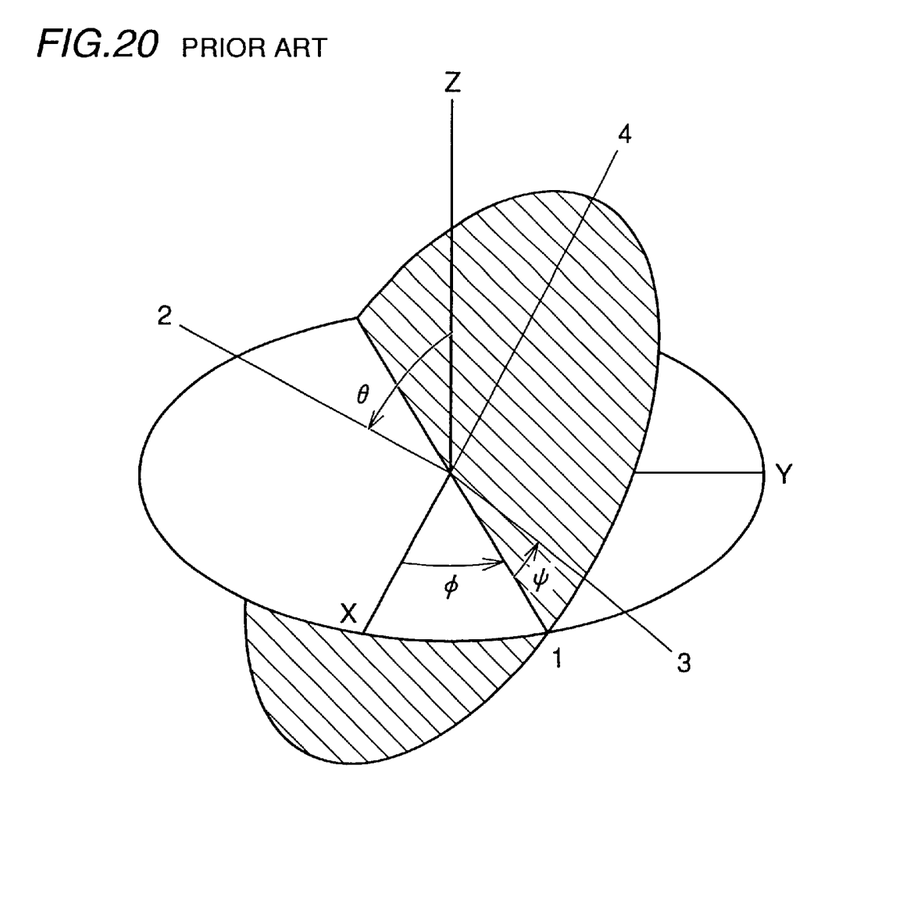
FIG. 20 is a diagram shown in conjunction with Eulerian angles

Referring to FIG. 20, the X axis is rotated by an angle $\phi$ toward the Y axis about the Z axis, and the axis obtained is defined as the first axis.

Then, the Z axis is rotated counterclockwise by an angle $\theta$ about the first axis, and the axis obtained is defined as the second axis. A material is cut in accordance with a surface orientation along a plane including the first axis and having the second axis as the normal, and used as a substrate. On the substrate which has been cut in accordance with the above mentioned surface orientation, the first axis is rotated counterclockwise by $\psi$ about the second axis, and newly defined as the third axis. The third axis corresponds to a direction in which the SAW propagates. An axis orthogonal to the third axis on the plane is defined as the fourth axis. Thus, the Eulerian angles ($\phi$, $\theta$, $\psi$) are defined.

A center frequency $f_0$ of a SAW device is determined in accordance with the following equation:

$$f_0 = V/\lambda$$

(V: propagation velocity of the SAW, $\lambda$: electrode pitch of the IDT (FIG. 17))

Thus, in producing devices having the same center frequency $f_0$, if the LT substrate with relatively high propagation velocity V as compared with that of the quartz substrate or the like, the electrode pitch of the IDT $\lambda$ increases and the size of the SAW device is increased.

It is commonly believed that the higher $K^2$ a piezoelectric substrate has, the easier is the design of a device with a large bandwidth. However, the LN substrate with a high $K^2$ is accompanied by a high TCD, and is not suitable for a device which should have a good temperature characteristic.

SUMMARY OF THE INVENTION

One object of the present invention is to provide a SAW device with a high $K^2$ and a good temperature characteristic and which can be reduced in size by lowering a propagation velocity.

After intense study to achieve the above mentioned object, the present inventors have found that a combination of a piezoelectric substrate, including LT, and a glass substrate makes it possible to reduce the size of a SAW device, and that high $K^2$ and a good temperature characteristic could be obtained if electrode pitch $\lambda$ and a thickness H of a piezoelectric substrate are set in a prescribed range.

Accordingly, the SAW device of the present invention is provided with a glass substrate, a piezoelectric substrate including LT formed on the glass substrate, and an electrode formed on the piezoelectric substrate. If an electrode pitch is $\lambda$, a thickness of the piezoelectric substrate is H, and K equals to $2\pi/\lambda$, then a product of K and H (KH) is at least 0.5 and at most 1.5.

The sound velocity of the glass substrate is less than that of the piezoelectric substrate including LT. If the glass substrate and the piezoelectric substrate are combined, the piezoelectric substrate is affected by the glass substrate, whereby the sound velocity of the SAW decreases. For example, the thinner the piezoelectric substrate, the more significant is the effect of the glass substrate and the lower the sound velocity of the SAW. If the thickness of the piezoelectric substrate is gradually increased, the sound velocity of the SAW gradually converges to that of the piezoelectric substrate.

When the glass substrate and the piezoelectric substance are bonded, the sound velocity of the SAW can be lowered by adjusting the thicknesses of the substrates. Thus, the electrode pitch $\lambda$ of the IDT is reduced and a smaller SAW device is achieved.

An electric field distribution varies with thickness H of the piezoelectric substrate and the electrode pitch $\lambda$. Here, the electric field distribution can be adjusted to concentrate in the piezoelectric substrate as the glass substrate and the piezoelectric substrate are combined and HK is set to at least 0.5 and at most 1.5. Thus, the SAW is efficiently excited, whereby $K^2$ is enhanced.

KH is set to at least 0.5 and at most 1.5 because if KH is below 0.5 or above 1.5, the sound velocity of the SAW increases, whereby it becomes difficult to reduce the size of the SAW device.

The signs of TCD and TCV (temperature coefficient of sound velocity (propagation velocity) of the glass substrate are opposite those of the piezoelectric substrate including LT. As to TCV, for example, the piezoelectric substrate including LT has a plus value, whereas the glass substrate has a minus value. Thus, if these substrates are bonded together, TCDs and TCVs thereof are mutually cancelled and the temperature characteristic is enhanced.

After intense study, the present inventors have found that setting Eulerian angles in a prescribed range could produce high a $K^2$ and a good temperature characteristic.

Accordingly, in the above described SAW device, LT is preferably any one of (0°, 20° to 40°, 0° to 10°), (10°, 20° to 30°, 155° to 180°), (0°, 20° to 40°, 170° to 180°), and (10°, 20° to 30°, 0° to 5°) in an Eulerian angles representation.

As a result, a substrate of the SAW device is obtained with a good temperature characteristic which is almost the same as that of the conventional 112° Y-X LT substrate and a propagation velocity which is lower than that of the 112° Y-X LT substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, an embodiment of the present invention will be described with reference to the drawings.

Figure 1:
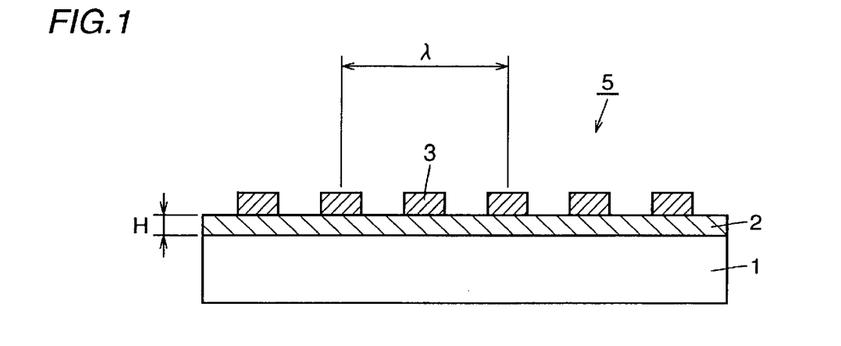
FIG. 1 is a schematic cross sectional view showing a structure of a SAW device according to one embodiment of the present invention.

Referring to FIG. 1, a SAW device 5 includes a glass substrate 1, a piezoelectric substrate 2, and an electrode 3. Piezoelectric substrate 2 is formed on glass substrate 1 and includes LT. Electrode 3 is formed on piezoelectric substrate 2 in accordance with the purpose of the device.

Such a SAW device 5 is obtained by bonding LT substrate 2 on the surface of glass substrate 1 or forming an LT thin film 2 on the surface of glass substrate 1, and then patterning to form electrode 3 on LT substrate (thin film) 2.

For a material of glass substrate 1, for example, quartz glass, aluminosilicate glass, borosilicate glass, soda glass, lead silicate glass or the like is used. The substrate, which is combined with LT substrate 2, is not limited to the glass substrate, and any material having a sound velocity lower than that of LT and having a sign which is opposite to those of TCD and TCV of LT may be used.

In addition, the material of piezoelectric substrate 2 may only or partially include LT. For example, aluminum, although not limited, may be used as the material of electrode 3.

If the thickness of piezoelectric substrate 2 is H, the pitch of electrode 3 is $\lambda$, and K equals to $2\pi/\lambda$, then KH is at least 0.5 and at most 1.5.

LT of piezoelectric substrate 2 is preferably any one of (0°, 20° to 40°, 0° to 10°), (10°, 20° to 30°, 155° to 180°), (0°, 20° to 40°, 170° to 180°), and (10°, 20° to 30°, 0° to 5°) in an Eulerian angles representation.

In the present embodiment, the combination of glass substrate 1 and LT substrate 2 enables the SAW device to be reduced in size. More specifically, glass substrate 1 is formed of a material having a sound velocity lower than that of LT substrate 2. The combination of glass substrate 1 and LT substrate 2 permits an influence of glass substrate 1 over LT substrate 2, so that the sound velocity of the SAW is reduced. Thus, electrode pitch λ is reduced and the SAW device per se is reduced in size.

Further, an electric field distribution varies with thickness H of LT substrate 2 and electrode pitch λ. Thus, by combining glass substrate 1 and LT substrate 2 and restricting KH to at least 0.5 and at most 1.5, the electric field distribution can be adjusted to concentrate in LT substrate 2. Accordingly, the SAW is effectively excited and $K^2$ is increased.

It is noted that KH is restricted to at least 0.5 and at most 1.5 because if KH is below 0.5 or above 1.5, the velocity of the SAW increases, whereby it becomes difficult to reduce the size of the SAW device.

Further, the combination of glass substrate 1 and LT substrate 2 enhances TCD and TCV. More specifically, as TCD and TCV of glass substrate 1 have signs opposite to those of LT substrate 2 (in the case of TCV, for example, LT substrate 2 has a plus value, whereas glass substrate 1 has a minus value), the combination of substrates 1 and 2 makes it possible to cancel TCDs and TCVs of the substrates. Therefore, a good temperature characteristic is obtained.

Figure 2:
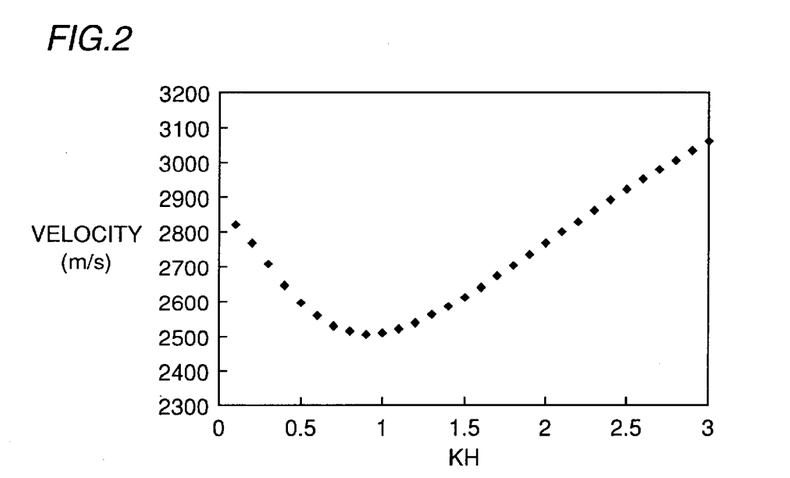
FIG. 2 is a graph shown in conjunction with a relationship between a propagation velocity of a (0°, 30°, 0°) LT/glass-structure substrate and a value of KH.
Figure 3:
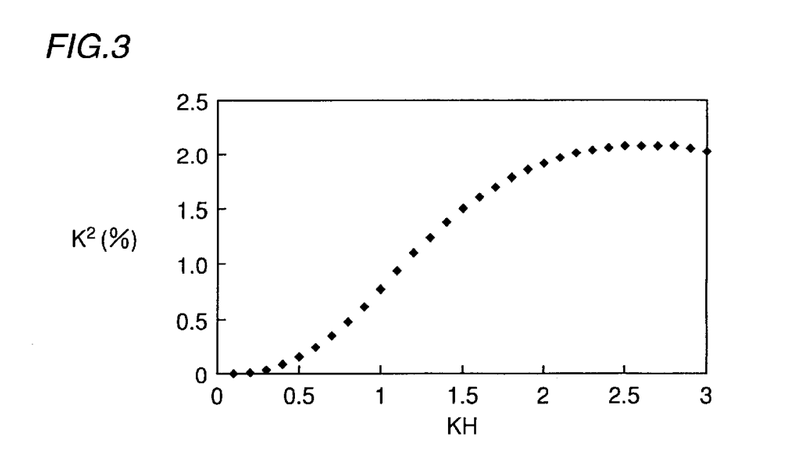
FIG. 3 is a graph shown in conjunction with a relationship between $K^2$ and KH of the (0°, 30°, 0°) LT/glass-structure substrate.
Figure 4:
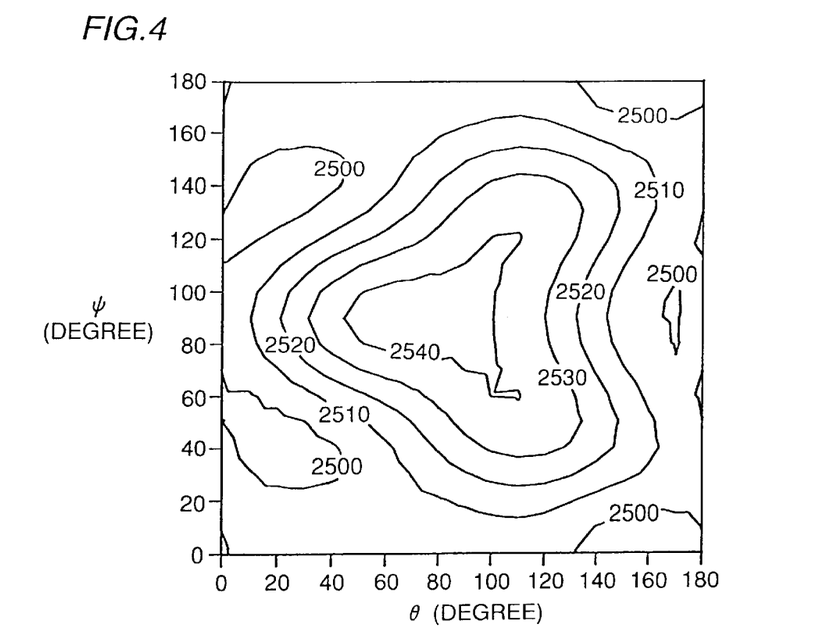
FIG. 4 is a graph shown in conjunction with a propagation velocity of a (0°, θ, ψ) LT (KH=0.9)/glass-structure substrate.
Figure 5:
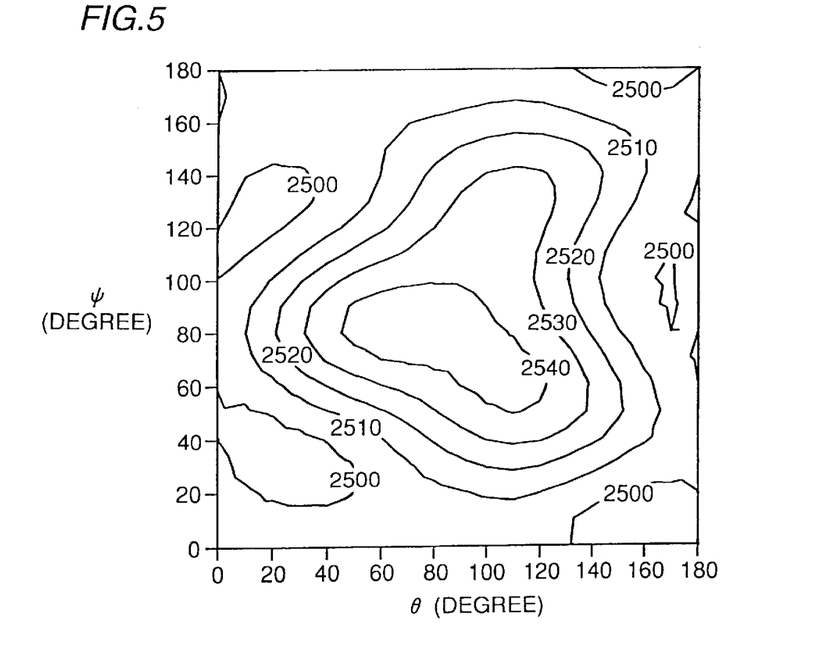
FIG. 5 is a graph shown in conjunction with a propagation velocity of a (10°, θ, ψ) LT KH=0.9)/glass-structure substrate.
Figure 6:
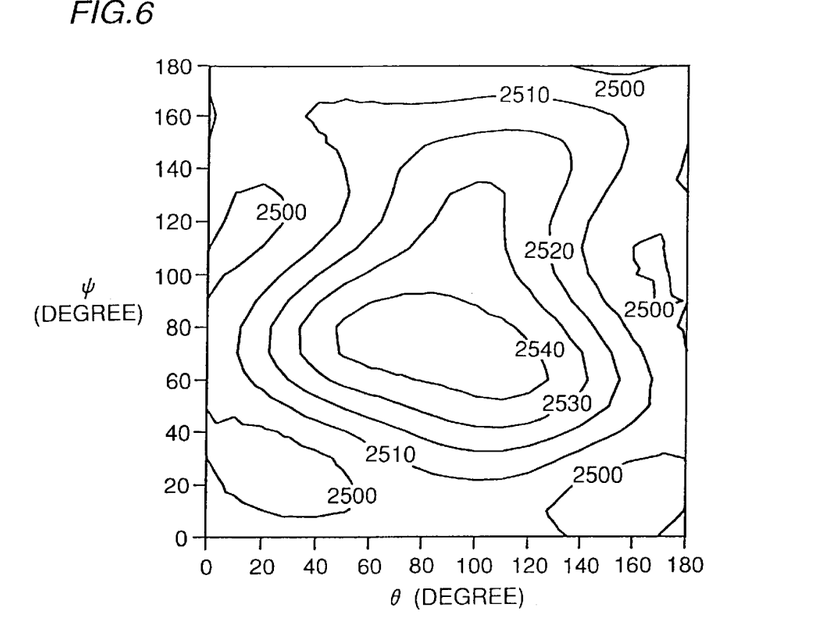
FIG. 6 is a graph shown in conjunction with a propagation velocity of a (20, θ, ψ) LT (KH=0.9)/glass-structure substrate.
Figure 7:
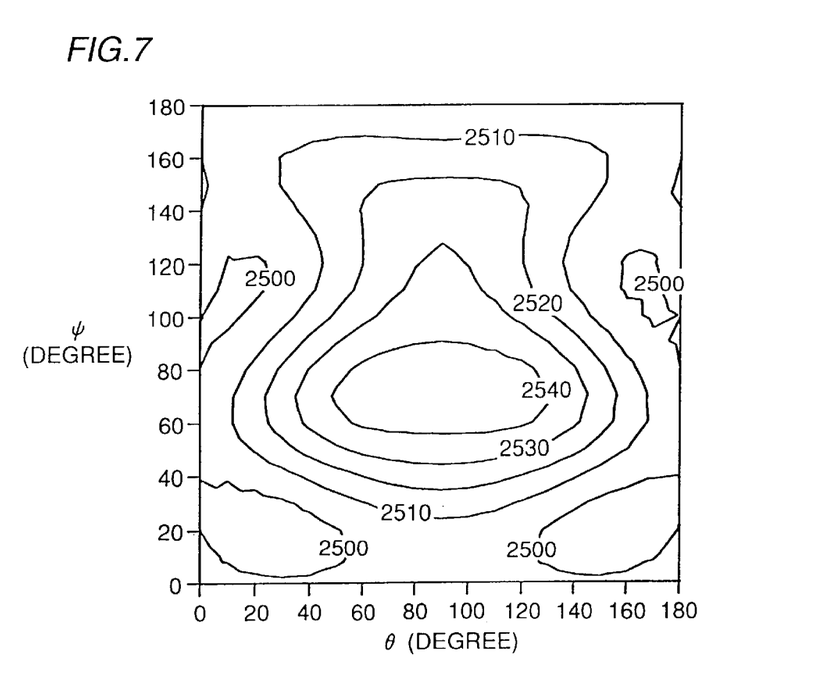
FIG. 7 is a graph shown in conjunction with a propagation velocity of a (30°, θ, ψ) LT (KH=0.9)/glass-structure substrate.
Figure 8:
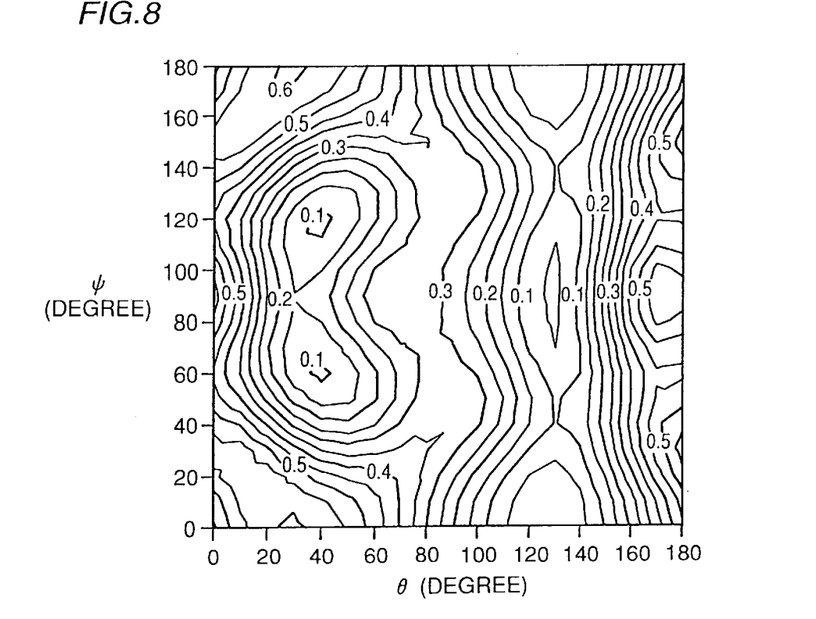
FIG. 8 is a graph shown in conjunction with $K^2$ of a (0°, θ, ψ) LT (KH=0.9)/glass-structure substrate.
Figure 9:
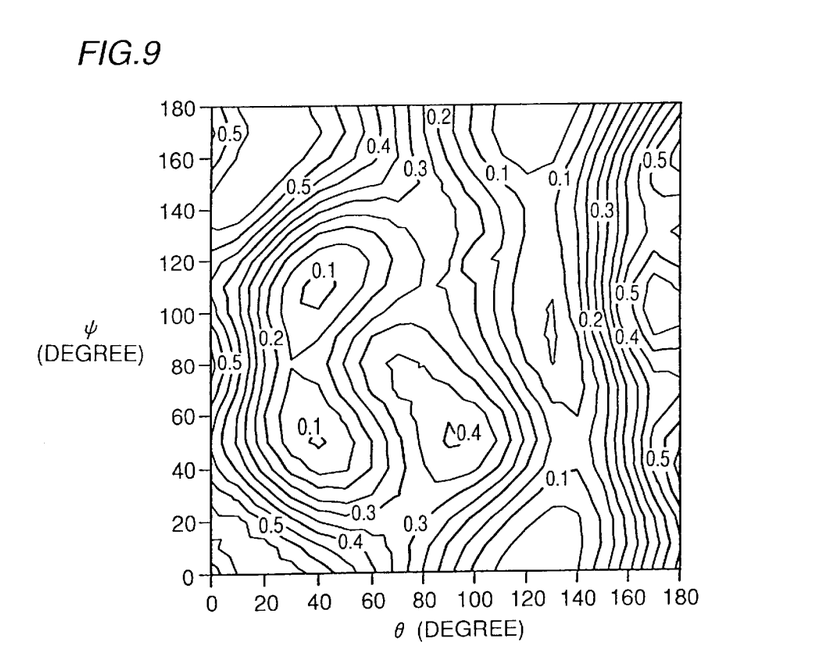
FIG. 9 is a graph shown in conjunction with $K^2$ of a (10°, θ, ψ) LT (KH=0.9)/glass-structure substrate.
Figure 10:
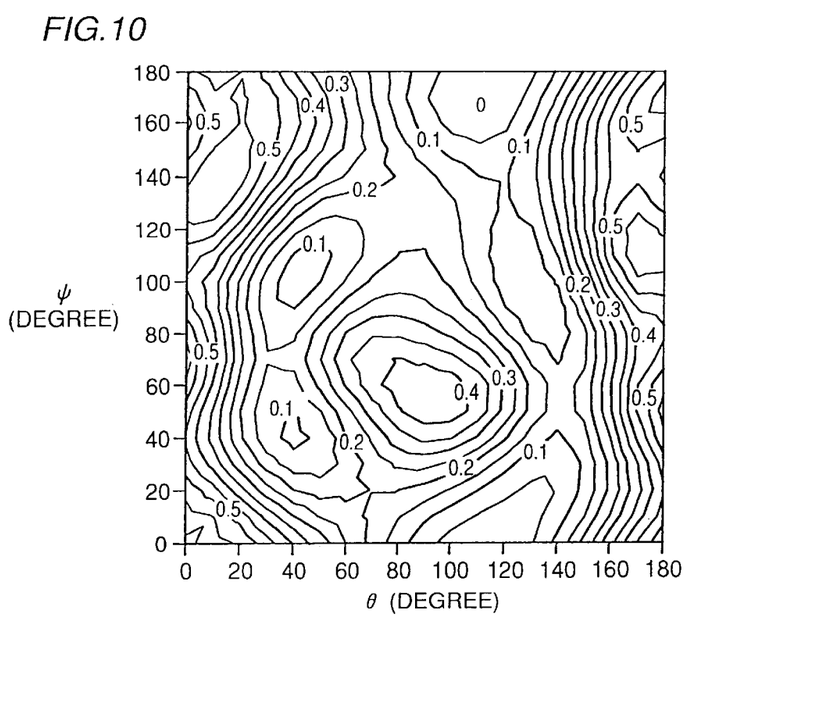
FIG. 10 is a graph shown in conjunction with $K^2$ of a (20°, θ, ψ) LT (KH=0.9)/glass-structure substrate.
Figure 11:
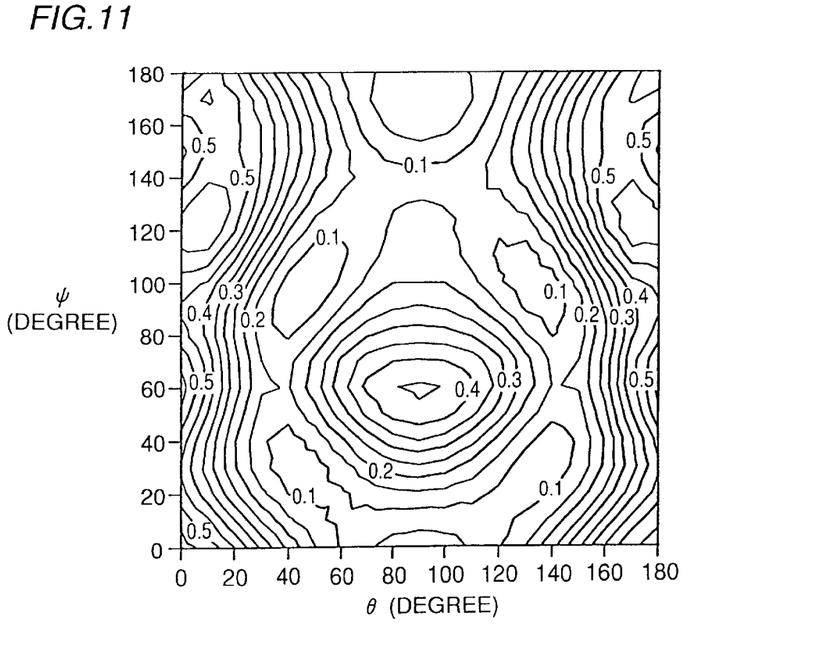
FIG. 11 is a graph shown in conjunction with $K^2$ of a (30°, θ, ψ) LT (KH=0.9)/glass-structure substrate.
Figure 12:
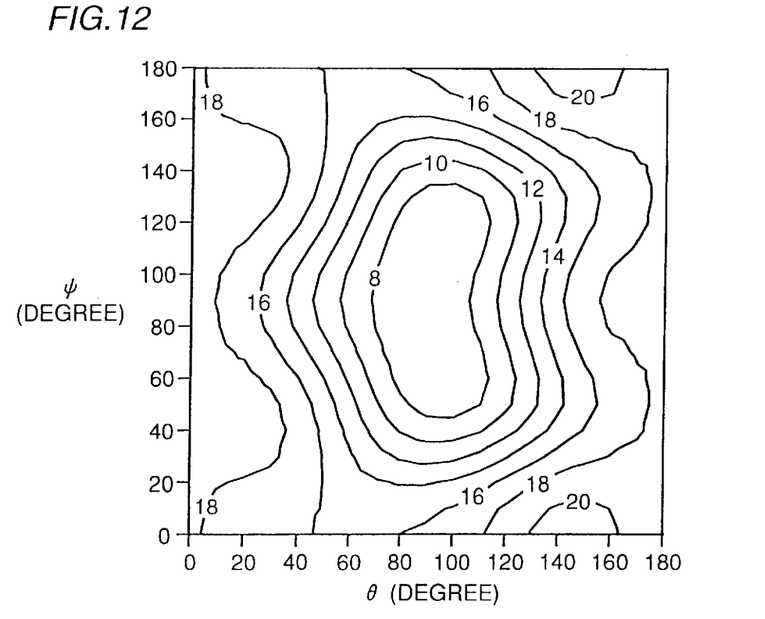
FIG. 12 is a graph shown in conjunction with TCD of a (0°, θ, ψ) LT (KH=0.9)/glass-structure substrate.
Figure 13:
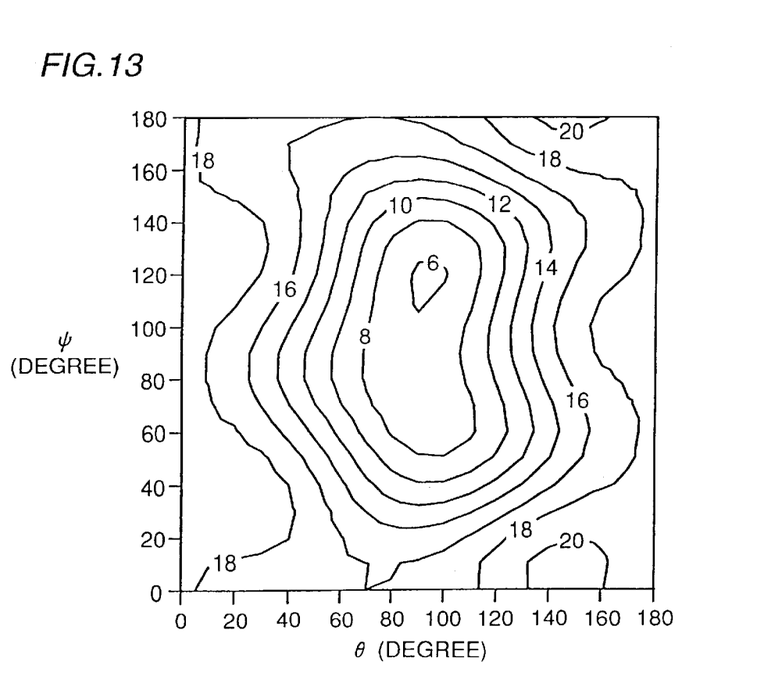
FIG. 13 is a graph shown in conjunction with TCD of a (10°, θ, ψ) LT (KH=0.9)/glass-structure substrate.
Figure 14:
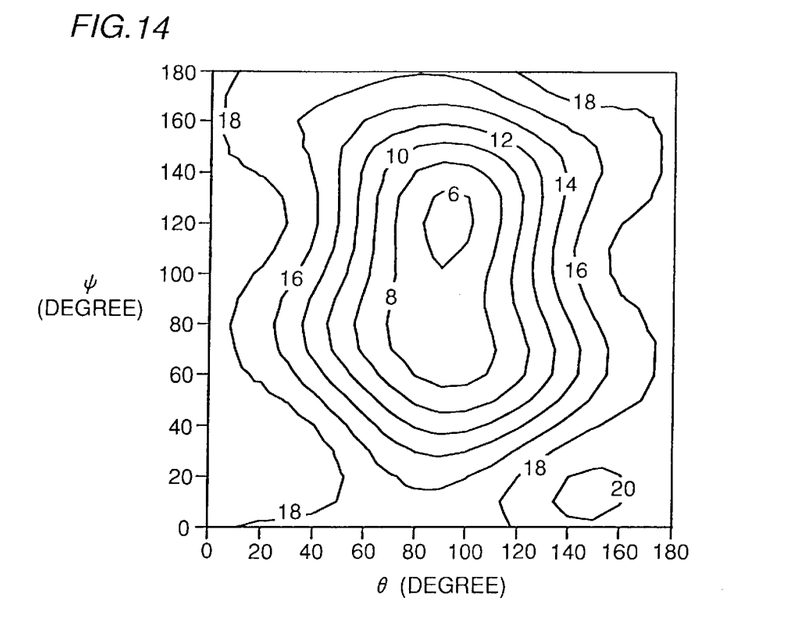
FIG. 14 is a graph shown in conjunction with TCD of a (20°, θ, ψ) LT (KH=0.9)/glass-structure substrate.
Figure 15:
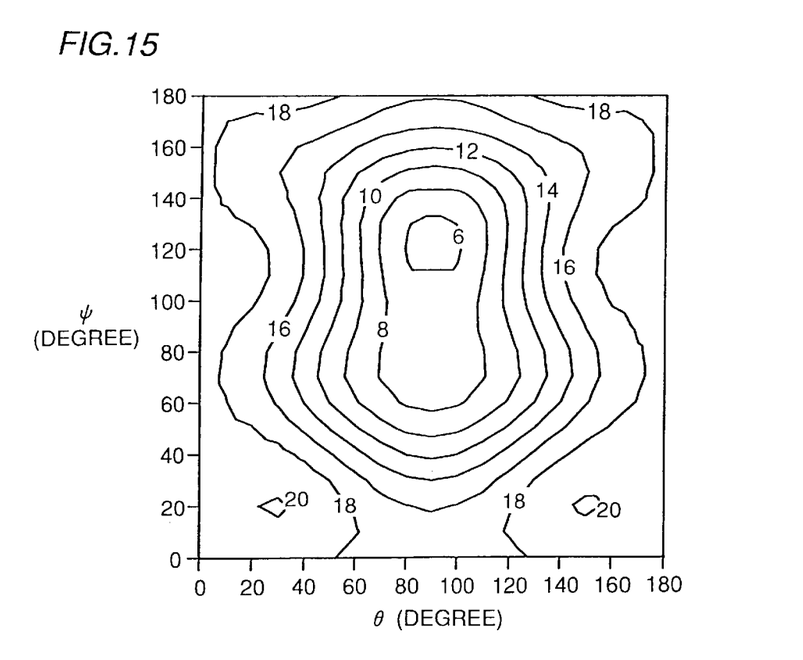
FIG. 15 is a graph shown in conjunction with TCD of a (30°, θ, ψ) LT (KH=0.9)/glass-structure substrate.

For an LT/glass-structure substrate having Eulerian angles of (0°, 30°, 0°) shown in FIG. 1, a relation between a KH parameter of LT and a propagation velocity was calculated. The result is shown in FIG. 2. The calculation range of KH of interest was 0≦KH≦3.0.

From FIG. 2, it was found that the propagation velocity was the lowest when KH equals 0.9, and the propagation velocity as low as 2600 m/s was achieved when KH was at least 0.5 and at most 1.5. Similar results were obtained for all orientations.

In a range where the KH parameter is at least 0.5 and at most 1.5, the smallest TCD was obtained when KH was about 0.5. TCD of (0°, 30°, 0°) LT (KH=0.5) at that point was 14.15 ppm/° C.

Further, in the range where the KH parameter was at least 0.5 and at most 1.5, a value of $K^2$ equaled to $K^2$ (=1.1%) of (90°, 90°, 112°) LT near the point where KH=1.3.

Thus, the lowest propagation velocity could be achieved when the KH parameter of LT was 0.9, and a sufficiently low propagation velocity was achieved when KH was at least 0.5 and at most 1.5.

Then, relations between the Eulerian angles and each of a propagation velocity, $K^2$, and TCD when KH parameter of LT was 0.9 were calculated. The calculation results for the propagation velocity and the Eulerian angles are shown in FIGS. 4 to 7. The calculation results for $K^2$ and the Eulerian angles are shown in FIGS. 8 to 11. The calculation results for TCD and the Eulerian angles are shown in FIGS. 12 to 15.

The above mentioned calculations were performed over the ranges of 0°≦φ≦30°, 0°≦θ≦180°, and 0°≦ψ≦180°, in view of the symmetry of the LT crystal property.

From the results shown in FIGS. 8 to 15, it was found that angles permitting $K^2$ that is higher than 0.55% and TCD that is lower than 18 ppm/° C. were (0°, 20° to 40°, 0° to 10°), (10°, 20° to 30°, 155° to 180°), (0°, 20° to 40°, 170° to 180°), or (10°, 20° to 30°, 0° to 5°). Further, from the results shown in FIGS. 4 to 7, it was found the propagation velocity was below 2510 m/s in the angle range of the present invention.

Further, from the results shown in FIGS. 4 to 11, it was found that the angles permitting the propagation velocity that is below 2510 m/s and $K^2$ that is higher than 0.6% were only at the points near (0°, 30°, 0°) and (0°, 30°, 180°)

The resulting TCD of (0°, 30°, 0°) LT (KH=0.9)/glass-structure substrate was 16.33 ppm/° C.

A material constant of glass generally used for the electronic material was used in the calculation. The material constant of glass used in the calculation is shown in the following Table 2.

TABLE 2

| Material Constant of Glass Used in Calculation | |
|---|---|
| density | 2.76 g/cm$^3$ |
| coefficient of thermal expansion | 46 × 10$^{-7}$ ° C. |
| dielectric constant | 5.8 |
| Young's modulus | 6.86 × 10$^3$ kg/mm$^2$ |
| Poisson's ratio | 0.28 |

To compare the cases where the LT/glass substrate of the present invention and the (90°, 90°, 112°) LT substrate of Table 1 were used, it was found that although TCD was almost the same, the propagation velocity was lower by about 25% in the present invention.

To compare the cases where the LT/glass substrate of the present invention and the (0°, 132.75°, 0°) quartz substrate shown in Table 1 are used, it was found that the present invention produced better results in both of $K^2$ and propagation velocity, although TCD was higher.

As described above, it was found that the LT/glass substrate with higher $K^2$ and lower propagation velocity as compared with the conventional case was obtained.

Now, an embodiment related to the manufacture of a SAW filter using the LT/glass substrate of the present invention having the above mentioned enhanced characteristics will be described.

Referring to FIG. 1, glass substrate 1 having the material constant shown in Table 2 and (0°, 30°, 0°) LT substrate 2 were bonded by a direct bonding technique, and an electrode 3 was formed on the surface of LT substrate 2. Here, the direct bonding technique allowed direct bonding of substrates without any adhesion layer interposed. More specifically, hydrophilicity was applied to glass substrate 1 and LT substrate 2, which had been polished and washed, by an ammonia based solution, and then substrates 1 and 2 were bonded together by overlay hydrogen bonding.

In the present embodiment, a thermal treatment was performed after bonding, in order to increase a bonding tightness. An aluminum film of 1000 Å was formed on the substrate of the LT/glass structure by sputtering, and patterning was performed by photolithography for electrodes 3.

Figure 16:
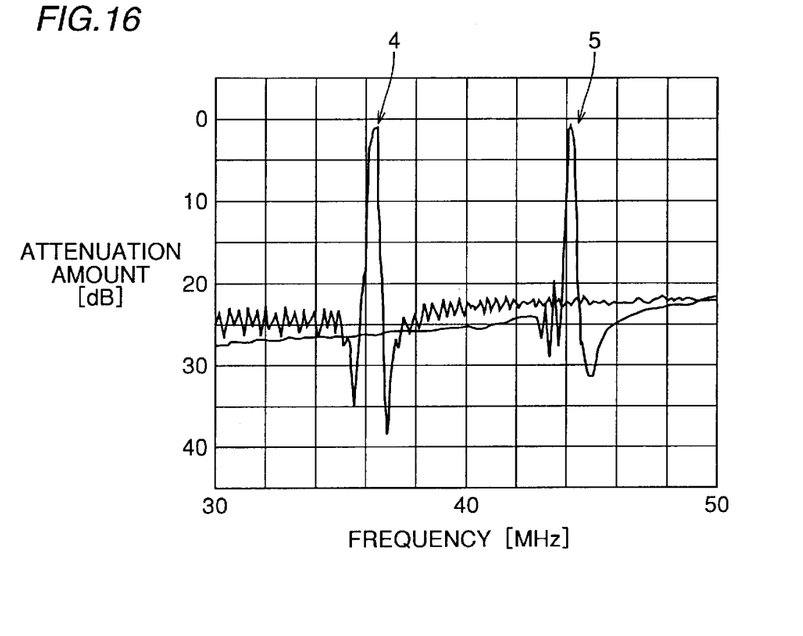
FIG. 16 is a graph showing in comparison frequency characteristics of SAW filters using the X-112° Y LT substrate and the LT/glass structure of the present invention.

Frequency characteristics of SAW filters respectively having electrodes which were deigned with the same parameter on the conventional X-112° Y LT substrate and the LT/glass substrate of the present invention were examined. The results are shown in FIG. 16. Here, electrode pitch λ is set at 69.8 μm such that KH equals 0.9.

Referring to FIG. 16, frequency characteristic 4 of the SAW filter having the LT/glass substrate of the present invention and a frequency characteristic 5 of the SAW filter having the conventional X-112° Y LT substrate are considerably different in resonance frequency. This is due to the fact the propagation velocity of the SAW filter of the present invention is less than that of the conventional SAW filter. To make the SAW filter of the present invention attain the same frequency band as for the conventional SAW filter, electrode pitch λ must be reduced. Thus, the SAW filter of the present invention can be reduced in size. To compare characteristics in the passband, there is not a significant difference in insertion losses and passband. Accordingly, the SAW filter of the present invention has the same level of $K^2$ as the conventional SAW filter.

As described above, with the substrate of the SAW device of the present invention, as the glass substrate and the piezoelectric substrate are bonded together, thicknesses thereof are adjusted to reduce the sound velocity of the surface acoustic wave. Accordingly, electrode pitch λ of an IDT is reduced and a corresponding reduction in size of the SAW device is achieved.

In addition, the glass substrate and the piezoelectric substrate are combined and KH is set to at least 0.5 and at most 1.5, so that the electric field distribution can be adjusted to concentrate in the piezoelectric substrate. Thus, the SAW can be efficiently excited and $K^2$ is increased.

Further, as the glass substrate and the piezoelectric substrate are bonded together, respective TCDs and TCVs are mutually cancelled, whereby the temperature characteristic is enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising:

a glass substrate;

a piezoelectric substrate including $LiTaO_3$ formed on said glass substrate; and an electrode formed on said piezoelectric substrate, wherein a product of K and H is at least 0.5 and at most 1.5, and wherein a pitch of said electrode is λ, a thickness of said piezoelectric substrate is H, and K equals 2π/λ.

2. The surface acoustic wave device according to claim 1, wherein said $LiTaO_3$ is anyone of (0°, 20° to 40°, 0° to 10°), (10°, 20°, to 30°, 155° to 180°), (0°, 20° to 40°, 170° to 180°), and (10°, 20° to 30°, 0° to 5°) in a Eulerian angles representation.

* * * * *